(12) United States Patent
West et al.

(10) Patent No.: US 10,896,885 B2
(45) Date of Patent: Jan. 19, 2021

(54) HIGH-VOLTAGE MOSFET STRUCTURES

(71) Applicants: Polar Semiconductor, LLC, Bloomington, MN (US); Sanken Electric Co., Ltd., Saitama (JP)

(72) Inventors: Peter West, Minneapolis, MN (US); Dosi Dosev, Woodbury, MN (US); Don Rankila, Farmington, MN (US); Tatsuya Kamimura, St. Louis Park, MN (US); Steve Kosier, Lakeville, MN (US)

(73) Assignees: Polar Semiconductor, LLC, Bloomington, MN (US); Sanken Electric Co., Ltd., Saitama (JP)

( * ) Notice: Subject to any disclaimer, the term of this patent is extended or adjusted under 35 U.S.C. 154(b) by 78 days.

(21) Appl. No.: 15/703,674

(22) Filed: Sep. 13, 2017

(65) Prior Publication Data

US 2019/0081016 A1 Mar. 14, 2019

(51) Int. Cl.
*H01L 23/00* (2006.01)
*H01L 29/78* (2006.01)
(Continued)

(52) U.S. Cl.
CPC ............ *H01L 24/05* (2013.01); *H01L 24/03* (2013.01); *H01L 24/85* (2013.01); *H01L 29/407* (2013.01);
(Continued)

(58) Field of Classification Search
CPC ..... H01L 24/04; H01L 29/4236; H01L 24/85; H01L 24/03; H01L 24/48; H01L 24/05;
(Continued)

(56) References Cited

U.S. PATENT DOCUMENTS 4,441,249 A * 4/1984 Alspector ............... H01L 28/40
257/296
4,577,390 A * 3/1986 Haken ................. H01L 21/3145
257/371

(Continued)

OTHER PUBLICATIONS

Ket et al., "Design on the Low-Capacitance Bond Pad for High Frequency I/O Circuits in CMOS Technology", IEEE Transaction on Electron Devices, vol. 48, No. 12, Dec. 2001. (Year: 2001).*

(Continued)

*Primary Examiner* — Allen L Parker
*Assistant Examiner* — Charles N Ausar-El
(74) *Attorney, Agent, or Firm* — Daly, Crowley, Mofford & Durkee, LLP

(57) ABSTRACT

Apparatus and associated methods relate to a bond-pad structure having small pad-substrate capacitance for use in high-voltage MOSFETs. The bond-pad structure includes upper and lower polysilicon plates interposed between a metal bonding pad and an underlying semiconductor substrate. The lower polysilicon plate is encapsulated in dielectric materials, thereby rendering it floating. The upper polysilicon plate is conductively coupled to a source of the high-voltage MOSFET. A perimeter of the metal bonding pad is substantially circumscribed, as viewed from a plan view perspective, by a perimeter of the upper polysilicon plate. A perimeter of the upper polysilicon plate is substantially circumscribed, as viewed from the plan view perspective, by a perimeter of the lower polysilicon plate. In some embodiments, the metal bonding pad is conductively coupled to a gate of the high-voltage MOSFET. The pad-substrate capacitance is advantageously made small by this bond-pad structure.

19 Claims, 8 Drawing Sheets

(51) Int. Cl.
*H01L 29/40* (2006.01)
*H01L 29/423* (2006.01)
*H01L 23/31* (2006.01)

(52) U.S. Cl.
CPC ...... *H01L 29/7827* (2013.01); *H01L 29/7828* (2013.01); *H01L 23/3171* (2013.01); *H01L 24/48* (2013.01); *H01L 29/4236* (2013.01); *H01L 2224/03013* (2013.01); *H01L 2224/04042* (2013.01); *H01L 2224/05073* (2013.01); *H01L 2224/05567* (2013.01); *H01L 2224/48227* (2013.01); *H01L 2224/48247* (2013.01); *H01L 2924/01029* (2013.01); *H01L 2924/13091* (2013.01); *H01L 2924/30105* (2013.01)

(58) Field of Classification Search
CPC H01L 29/7827; H01L 29/407; H01L 29/7828
See application file for complete search history.

(56) References Cited

U.S. PATENT DOCUMENTS

| | | | | |
|---|---|---|---|---|
| 4,914,546 A * | 4/1990 | Alter | H01L 27/0805 | 257/306 |
| 5,065,220 A * | 11/1991 | Paterson | H01L 21/31111 | 257/315 |
| 5,734,200 A * | 3/1998 | Hsue | H01L 24/03 | 257/755 |
| 5,840,605 A * | 11/1998 | Tuan | H01L 27/10852 | 438/253 |
| 6,127,812 A * | 10/2000 | Ghezzo | H02J 7/32 | 307/110 |
| 6,696,726 B1 * | 2/2004 | Bencuya | H01L 29/7813 | 257/330 |
| 7,233,075 B2 * | 6/2007 | Hung | H01L 24/05 | 257/786 |
| 7,268,395 B2 * | 9/2007 | Qu | H01L 29/407 | 257/342 |
| 7,335,966 B2 * | 2/2008 | Ihme | H01L 24/18 | 257/532 |
| 7,592,710 B2 * | 9/2009 | Hsia | H01L 24/05 | 257/202 |
| 8,183,698 B2 * | 5/2012 | Antol | H01L 23/528 | 257/780 |
| 9,070,716 B2 * | 6/2015 | Park | H01L 29/4908 | |
| 9,093,375 B2 * | 7/2015 | Yen | H01L 28/20 | |
| 10,388,783 B2 * | 8/2019 | Rankila | H01L 29/42376 | |
| 10,522,675 B2 | 12/2019 | Kadow | H01L 29/7397 | |
| 10,586,792 B2 | 3/2020 | Ahlers | H01L 27/0292 | |
| 2005/0153497 A1 * | 7/2005 | Bencuya | H01L 29/7813 | 438/197 |
| 2005/0167742 A1 * | 8/2005 | Challa | H01L 21/3065 | 257/328 |
| 2005/0275016 A1 * | 12/2005 | Qu | H01L 29/407 | 257/342 |
| 2006/0091566 A1 * | 5/2006 | Yang | H01L 24/05 | 257/786 |
| 2006/0125118 A1 * | 6/2006 | Yamazaki | H01L 24/03 | 257/784 |
| 2006/0214221 A1 * | 9/2006 | Challa | H01L 21/3065 | 257/328 |
| 2006/0281249 A1 * | 12/2006 | Yilmaz | H01L 29/66727 | 438/243 |
| 2007/0023918 A1 * | 2/2007 | Kuechenmeister | H01L 24/03 | 257/774 |
| 2007/0032020 A1 * | 2/2007 | Grebs | H01L 29/407 | 438/272 |
| 2007/0194374 A1 * | 8/2007 | Bhalla | H01L 29/407 | 257/330 |
| 2007/0275549 A1 * | 11/2007 | Wang | H01L 21/76801 | 438/612 |
| 2008/0017920 A1 * | 1/2008 | Sapp | H01L 29/407 | 257/330 |
| 2009/0111231 A1 * | 4/2009 | Grebs | H01L 29/407 | 438/270 |
| 2009/0194889 A1 * | 8/2009 | Jeng | H01L 24/05 | 257/786 |
| 2009/0309156 A1 * | 12/2009 | Darwish | H01L 29/41766 | 257/332 |
| 2010/0140689 A1 * | 6/2010 | Yedinak | H01L 29/0692 | 257/330 |
| 2010/0140695 A1 * | 6/2010 | Yedinak | H01L 29/7827 | 257/334 |
| 2011/0136310 A1 * | 6/2011 | Grivna | H01L 29/407 | 438/270 |
| 2011/0233659 A1 * | 9/2011 | Tai | H01L 29/407 | 257/330 |
| 2012/0235230 A1 * | 9/2012 | Park | H01L 29/4236 | 257/331 |
| 2014/0264567 A1 * | 9/2014 | Challa | H01L 29/7827 | 257/330 |
| 2015/0043114 A1 * | 2/2015 | Sarkar | H01L 27/0266 | 361/56 |
| 2017/0040275 A1 * | 2/2017 | Venkatadri | H01L 24/06 | |
| 2017/0200822 A1 * | 7/2017 | Li | H01L 29/7813 | |
| 2017/0236934 A1 * | 8/2017 | Rankila | H01L 29/7813 | 257/330 |
| 2017/0365708 A1 * | 12/2017 | Li | H01L 29/7813 | |
| 2018/0012958 A1 * | 1/2018 | Yedinak | H01L 29/7397 | |
| 2018/0033681 A1 * | 2/2018 | Ishikawa | H01L 21/76254 | |
| 2018/0233466 A1 * | 8/2018 | Yen | H01L 24/03 | |

OTHER PUBLICATIONS

Hsiaso et al., "Bond Pad Design with Low Capacitance in CMOS Technology for RF Applications", IEEE Electron Device Letters, vol. 28, No. 1, Jan. 2007 (Year: 2007).*

* cited by examiner

HIGH-VOLTAGE MOSFET STRUCTURES

BACKGROUND

Bonding pads provide a method of electrically interconnecting semiconductor devices to circuitry external to the semiconductor device. The bonding pad presents an exposed metal surface for the purpose of electrical connection to the external circuitry. This electrical connection can be performed in various manners, such as wire bonding, solder bumps, gold bumps, etc. The relative size of a bonding pad is relatively large compared with typical minimum device dimensions that can be produced with standard semiconductor processes. The bonding pads are relatively large to facilitate connection via wires and bumps that are large compared to the dimension of the devices manufactured on the semiconductor device.

Because the bonding pad is relatively large, the parasitic electrical parameters associated with the bonding pad can also be relatively large. For example, a bonding pad has a parasitic capacitance associated with the bonding pad. The parasitic capacitance can deleteriously reduce the performance of a device electrically connected to the bonding pad. Thus, the present disclosure is directed to bonding-pad structures that reduce the parasitic capacitance associated therewith.

SUMMARY

Apparatus and associated methods relate to a bonding-pad structure for minimizing capacitance to a drain-biased semiconductor substrate of a high-voltage MOSFET. The bonding-pad structure includes a first dielectric layer on top of the semiconductor substrate. A first polysilicon plate is disposed on top of the first dielectric layer. A second dielectric layer is formed on top of the first polysilicon plate. The first and second dielectric layers encapsulate the first polysilicon plate, thereby electrically isolating the first polysilicon plate from the semiconductor substrate. A second polysilicon plate is disposed on top of the second dielectric layer. The second polysilicon plate is conductively coupled to a source of the high-voltage MOSFET. A third dielectric layer is formed on top of the second polysilicon layer. A metal bonding pad is disposed on top of the third dielectric layer. The metal bonding pad is electrically isolated from both the first and second polysilicon plates.

Some embodiments relate to a method of manufacturing a bonding pad. The method includes providing a semiconductor substrate and depositing a first dielectric layer on top of the provided semiconductor substrate. A first polysilicon layer is then deposited on top of the deposited first dielectric layer. The deposited first polysilicon layer is selectively etched so as to produce a first polysilicon plate. Then, a second dielectric layer is deposited on top of the first polysilicon plate. The deposited first and second dielectric layers encapsulate the first polysilicon plate, thereby electrically isolating the first polysilicon plate from the semiconductor substrate. A second polysilicon layer is deposited on top of the deposited second dielectric layer. Then the deposited second polysilicon layer is selectively etched so as to produce a second polysilicon plate. The second polysilicon plate is conductively coupled to a source of the high-voltage MOSFET. Then, a third dielectric layer is deposited on top of the second polysilicon plate. A metal bonding pad is formed on top of the deposited third dielectric layer. The metal bonding pad is electrically isolated from both the first and second polysilicon plates.

DETAILED DESCRIPTION

Apparatus and associated methods relate to a bond-pad structure having small pad-substrate capacitance for use in high-voltage MOSFETs. The bond-pad structure includes upper and lower polysilicon plates interposed between a metal bonding pad and an underlying semiconductor substrate. The lower polysilicon plate is encapsulated in dielectric materials, thereby rendering it floating. The upper polysilicon plate is conductively coupled to a source of the high-voltage MOSFET. A perimeter of the metal bonding pad is substantially circumscribed, as viewed from a plan view perspective, by a perimeter of the upper polysilicon plate. A perimeter of the upper polysilicon plate is substantially circumscribed, as viewed from the plan view perspective, by a perimeter of the lower polysilicon plate. In some embodiments, the metal bonding pad is conductively coupled to a gate of the high-voltage MOSFET. The pad-substrate capacitance is advantageously made small by this bond-pad structure.

Figure 1:
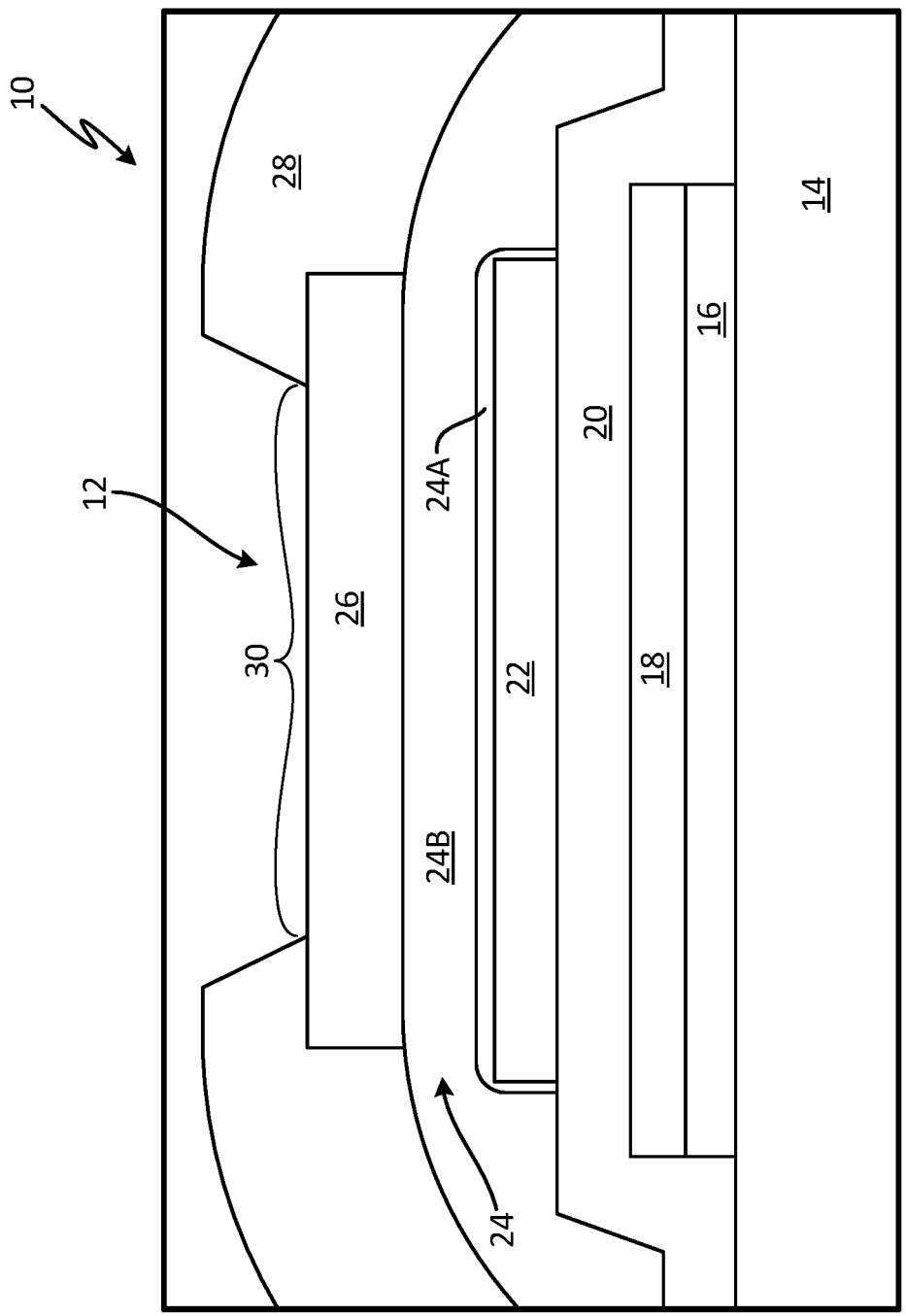
FIG. 1 is a drawing of a cross-sectional view of an exemplary low-capacitance gate bonding pad.

FIG. 1 is a drawing of a cross-sectional view of an exemplary low-capacitance gate bonding pad. In FIG. 1, a portion of a high-voltage MOSFET 10 that includes bonding-pad structure 12 is shown. Bonding-pad structure 12 includes a series of layers of various materials. Beginning from the bottom of the depicted embodiment, bonding-pad structure 12 is formed on top of semiconductor substrate 14. On top of semiconductor substrate 14 is first dielectric layer 16. In some embodiments, first dielectric layer is formed by oxidizing the top surface of semiconductor substrate 14. In some embodiments, first dielectric layer 16 is called a liner oxide. On top of first dielectric layer 16 is first polysilicon plate 18. Above first polysilicon plate 18 is second dielectric layer 20. First polysilicon plate 18 can be electrically coupled to a source electrode of the high-voltage MOSFET or first and second dielectric layers 16 and 20 can encapsulate first polysilicon plate 18 thereby floating or isolating first polysilicon plate 18 from other conductive regions and electrical nets of high-voltage MOSFET 10. In some embodiments, second dielectric layer 20 includes a high-density deposited (HDP) glass.

Second polysilicon plate 22 is formed above second dielectric layer 20. Third dielectric layer 24 is formed above second polysilicon plate 22. In some embodiments, second polysilicon plate 22 is oxidized, thereby creating an oxidation coating 24A on the top and sides of second polysilicon plate 22. In some embodiments, third dielectric layer 24 includes a borophosphosilicate glass layer 24B. Above third dielectric layer 24 is metal bonding pad 26. Above metal bonding pad 26 is polyimide film 28. Polyimide film 28 has been selectively removed, thereby exposing portion 30 of metal bonding pad 26 so as to permit a bond wire to be bonded thereto. For example, selectively removing polyimide film 28 at portion 30, which is inset from a periphery of metal bonding pad 26, permits electrical connection between metal bonding pad 26 of high-voltage MOSFET 10 and an electrical component external to the semiconductor die (e.g., a package, a lead-frame, a circuit board, and/or other electrical circuit element).

Between the metal bonding pad 26 and semiconductor substrate 14 are two separate polysilicon plate(s) 18 and/or 22, each isolated above and below by dielectric layers 16 and 20 and/or dielectric layers 20 and 24, respectively. First and second polysilicon plate(s) 18 and/or 22 are configured to provide electrical shielding between metal bonding pad 26 and semiconductor substrate 12 upon which bonding-pad structure 12 is formed. Such electrical shielding provides a low capacitance and low leakage current between metal bonding pad 26 and semiconductor substrate 12. In some embodiments, semiconductor substrate 14 is drain biased beneath all or most of metal bonding pad 26. In some embodiments, both metal bonding pad 26 and second polysilicon plate 22 are gate biased. In other embodiments, second polysilicon plate 22 can be floating or source biased. Thus, a large voltage differential can be produced for high-voltage MOSFET 10 between drain biased semiconductor substrate 14, and metal bonding pad 26, for example.

In some embodiments, semiconductor substrate 14 of high-voltage MOSFET 10 is conductively coupled to a drain of high-voltage MOSFET 10. Thus, the substrate is drain-biased, and the substrate can be biased to a maximum drain voltage that can be specified for high-voltage MOSFET 10. In some embodiments, metal bonding pad 26 can be conductively coupled to a gate of high-voltage MOSFET 10. Such conductive coupling of the gate to metal bonding pad 26 can be achieved via interconnect wiring, vias and/or contacts.

In some applications, high-voltage MOSFET 10 is configured to amplify and invert the gate-voltage signal supplied to high-voltage MOSFET 10. This amplified and inverted gate-voltage signal can be provided as a drain voltage signal. An effective capacitance between the gate and the drain, as seen from the gate terminal, of high-voltage MOSFET 10 configured in such a manner can be many times higher than the actual capacitance between the gate and drain. This amplification of the capacitance is called the Miller amplification. Because of the inversion and gain between these two nodes, from the perspective of the gate terminal the capacitance acts as if it were (1-Av) times the actual capacitance between the gate and drain. Here Av is the voltage gain at the drain with respect to the gate, and (1-Av) is often called the Miller gain. Because the effective capacitance—the Miller capacitance—can be many times larger than the actual capacitance, reducing the actual gate-drain capacitance can be very advantageous. Gate-drain capacitance can be reduced without increasing the thickness of second dielectric layer 24 by forming first polysilicon plate 18 between substrate 14 and metal bonding pad 26.

Providing shield(s), such as polysilicon plates 18 and/or 22 surrounded by dielectric layers 16 and 20 and/or dielectric layers 20 and 24, respectively, between the gate bonding pad and the drain-biased substrate can reduce the actual capacitance between the metal bonding pad 26 and semiconductor substrate 14. Polysilicon plate(s) 18 and/or 22 serve as electrical shields between metal bonding pad 26 and semiconductor substrate 14. The actual capacitance between metal bonding pad 26 and second polysilicon plate 22 can be greater than the capacitance between metal bonding pad 26 and semiconductor substrate 14 would be without intervening polysilicon plate(s) 18 and/or 22. By forming lower polysilicon plate 18 the distance separating upper polysilicon plate 22 and substrate 14 can be increased, thereby decreasing the capacitance therebetween.

Although the actual capacitance between metal bonding plate 26 and second polysilicon plate 22 is larger than the capacitance between metal bonding plate 26 and substrate 14, the metal bonding plate 26/second polysilicon plate 22 effective capacitance can still be much less than the metal bonding plate 26/substrate 14 effective capacitance, because of Miller gain. This can result in a lower effective capacitance, as seen from the gate terminal. In some embodiments, the upper and/or lower polysilicon plates can be isolated (e.g., floating) or conductively coupled to some biasing node (e.g., source terminal) other than the gate terminal. In the depicted embodiment, electrical biasing of the upper and lower polysilicon plates is not shown. In biased polysilicon plate embodiments, the Miller amplification can be unity, and therefore the effective capacitance seen by metal bonding pad 26 is equal to the actual capacitance between metal bonding pad 26 and the biased polysilicon plate 18 or 22 nearest to metal bonding pad 26.

Figure 2:
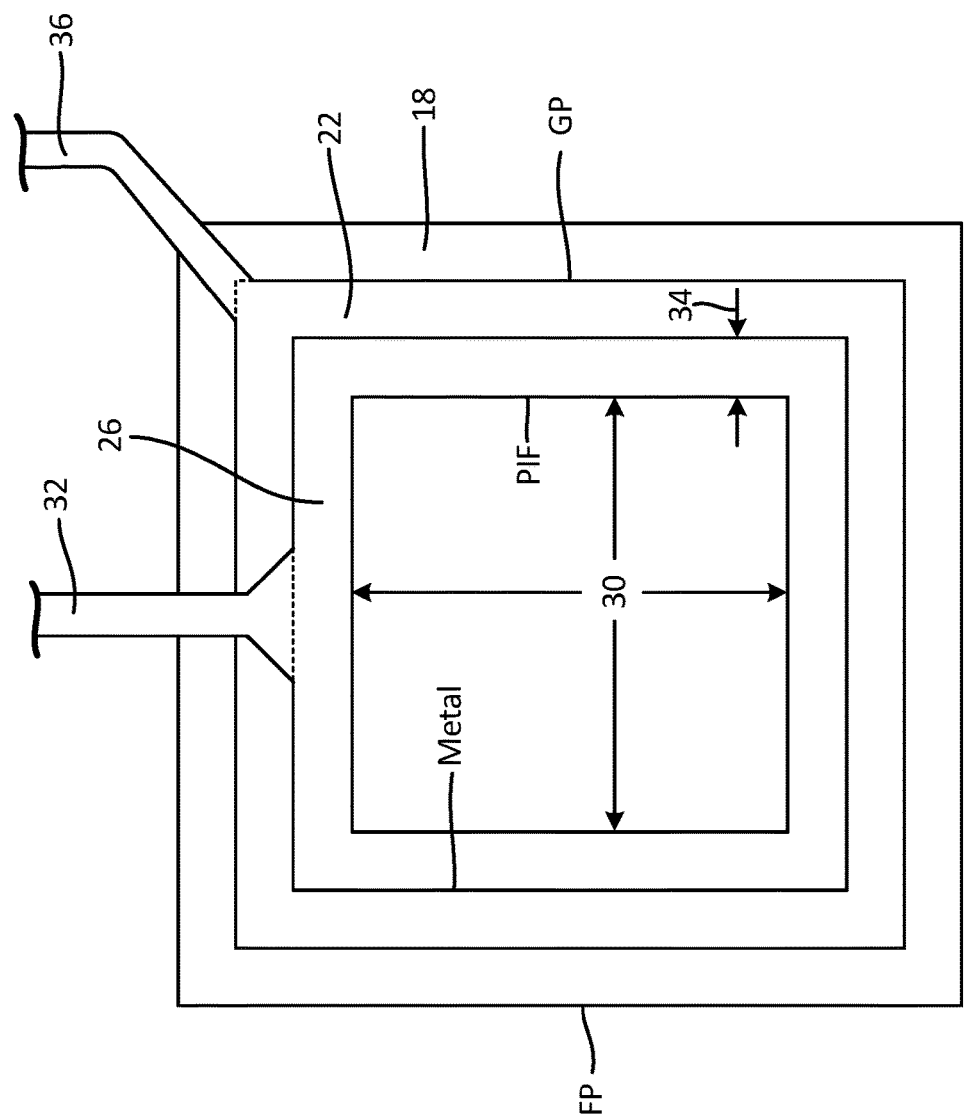
FIG. 2 is a plan view of a layout of an exemplary low-capacitance gate bonding pad.

FIG. 2 is a plan view of a layout of an exemplary low-capacitance gate bonding pad. In FIG. 2, four specific layers have been identified: i) Field Plate polysilicon feature (FP); ii) Gate Polysilicon feature (GP); iii) Metal feature; and iv) Polyimide Film feature (PIF). In the depicted embodiment, the Gate Polysilicon feature (GP) is the upper or second polysilicon plate 22 depicted in FIG. 1. The Field Plate polysilicon feature (FP) is the lower or first polysilicon plate 18 depicted in FIG. 1. In the depicted embodiment, Polyimide Film feature PIF is a layout feature that defines portion 30 from which the polyimide film 28 is removed, thereby exposing a portion of the underlying metal bonding pad 26.

A perimeter of the depicted Polyimide Film feature PIF is entirely circumscribed by a perimeter of underlying metal bonding pad 26 as defined by the Metal feature. The Metal feature includes metal bonding pad 26 and metal interconnect wire 32 laterally extending from metal bonding pad 26. Metal bonding pad 26 includes the portion 30 exposed by the selective remove of the polyimide film 28 as defined by the PolyImide Film feature PIF as well as metal skirt 34 surrounding the PolyImide Film feature PIF.

The perimeter of the depicted metal bonding pad 26 is substantially circumscribed by a perimeter of the underlying upper polysilicon plate 22 as defined by the Gate Polysilicon feature GP. The perimeter of the depicted metal bonding pad 26 is not entirely circumscribed by a perimeter of the underlying upper polysilicon plate 22, because metal interconnect wire 32 (e.g., to provide electrical conduction between metal bonding pad 26 and the gate of the device) laterally extends from metal bonding pad 26. Herein the term "substantially circumscribing" means that if the extending interconnecting wire(s) is severed from the substantially circumscribed layer, the remaining feature is entirely circumscribed. The Gate Polysilicon GP feature includes upper polysilicon plate 22 and polysilicon interconnect wire 36 laterally extending from upper polysilicon plate 22. The perimeter of the depicted metal bonding pad 26 traverses laterally extending polysilicon wire 36, thereby defining a connection location of laterally extending polysilicon wire 36 (e.g., to provide biasing of upper polysilicon plate 22) to upper polysilicon plate 22. Laterally extending polysilicon wire 36, can provide conductive connection between the source of high-voltage MOSFET 10 and upper polysilicon plate. Such conductive connection can be achieved via interconnect wiring, vias and/or contacts. The perimeter of the depicted upper polysilicon plate 22 is circumscribed by a perimeter of the underlying lower polysilicon plate 18 as defined by the Field Plate polysilicon FP feature.

Figure 3:
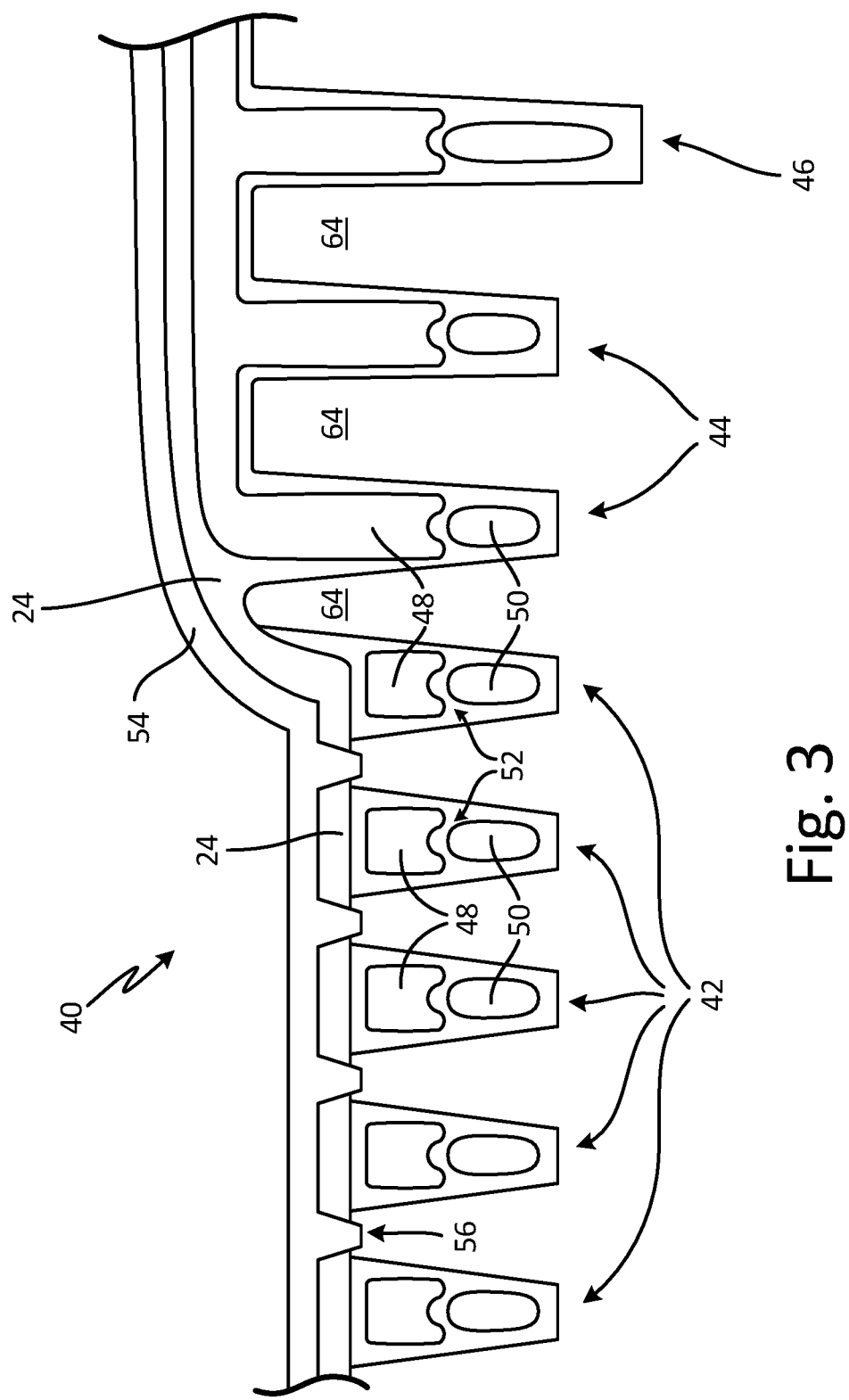
FIG. 3 is a cross-sectional view of an exemplary MOSFET with integral edge-termination structures.

FIG. 3 is a cross-sectional view of an exemplary MOSFET with integral edge-termination structures. In FIG. 3, MOSFET 40 includes active-device trenches 42, edge-termination trenches 44, and periphery trench 46. Note that periphery trench 46 has a latitudinal width that is larger than latitudinal widths of active-device trenches 42 and edge-termination trenches 44. Because periphery trench 46 has a larger latitudinal width, periphery trench 46 is also deeper than active-device trenches 42 and edge-termination trenches 44. Each of active-device trenches 42, edge-termination trenches 44, and periphery trench 46 has dielectric sidewalls and a dielectric bottom. The dielectric sidewalls and dielectric bottom electrically isolating a conductive core within each of the longitudinal trenches from a drain-biased region outside of and adjacent to the longitudinal trench. In the depicted embodiment, the conductive core includes conductive gate polysilicon 48 and conductive field polysilicon 50, separated from conductive gate polysilicon 48 by inter-polysilicon dielectric 52.

In the depicted embodiment, gate polysilicon 48 is patterned to act as a field plate extending over the top of the active die between and beyond edge-termination trenches 44 and periphery trench 46. MOSFET 40 also includes metallization layer 54, which in this cross-sectional view makes electrical contact with source 56 of MOSFET 40. Metallization layer 54 has been patterned so that it also acts as a field plate extending directly over edge-termination trenches 44, and periphery trench 46.

Figure 8:
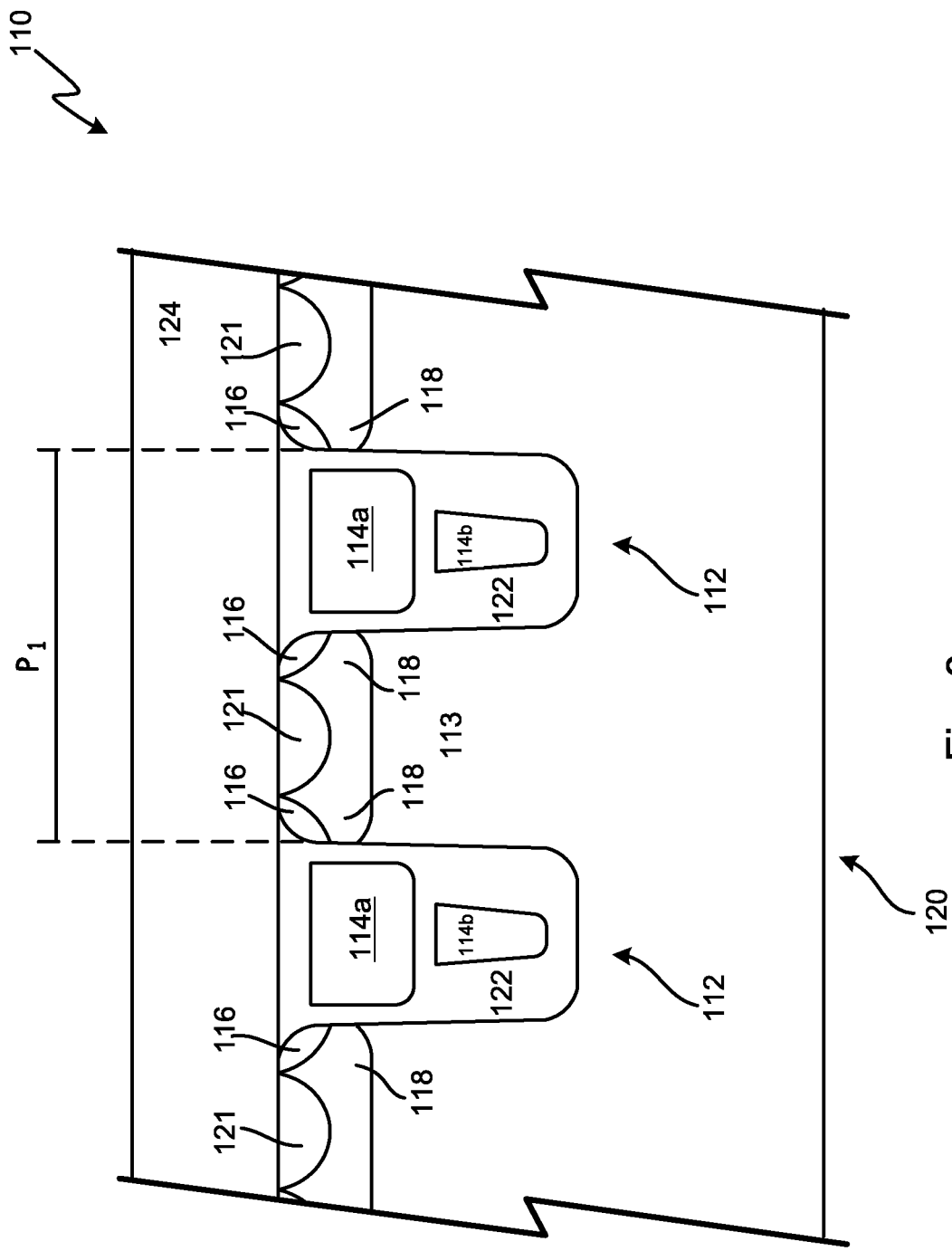
FIG. 8 is a cross-sectional view illustrating a split-gate trench power metal-oxide semiconductor field-effect transistor (MOSFET).

Active-device trenches 42 of MOSFET 40 have been disclosed by Kosier et al. in U.S. patent application Ser. No. 14/989,032, filed Jan. 6, 2016, titled "Self-Aligned Split-Gate Trench Power MOSFET," the entire disclosure of which is hereby incorporated by reference. An embodiment of a split-gate trench MOSFET disclosed in the Kosier application will be described with respect to FIG. 8 below. FIG. 8 is a reproduction of FIG. 1 of the Kosier application.

FIG. 8 is a side elevation view of a cross-section of split-gate trench MOSFET 110. Split-gate trench MOSFET 110 includes trenches 112 etched into silicon layer 113, gate structures 114a and 114b, source regions 116, body regions 118, and drain 120. Body regions 118 may include heavily doped regions 121. Gate structures 114a and 114b are separated from source regions 116, body regions 118, and drain 120 by dielectric 122. Topside metal 124 is formed over silicon layer 113 and configured to contact, for example, heavily doped regions 121 and source regions 116. Dielectric 122 may be relatively thin so as to facilitate the field effect of gate structures 114a and 114b upon body region 118. Gate structures 114a and 114b may be, for example, polysilicon, and dielectric 122 may be silicon-dioxide. Source regions 116 and drain 120 may be doped either both n-type or p-type depending on the desired transistor species, with body regions 118 being doped opposite the type of source regions 116 and drain 120.

Trenches 112 include device gate structure 114a and field gate structure 114b therein. Field gate structure 114b may be biased such that field gate structures 114b in adjacent trenches 112 effectively shield intervening semiconductor pillars (i.e. the portion of silicon layer 113 located between adjacent trenches 112) from excessive voltage. Drain 120 may be biased, for example, with a high voltage via a backside wafer connection (not shown). Field gate structures 114b on either side of semiconductor pillars can effectively shield the respective semiconductor pillar from voltages that might cause breakdown of MOSFET 110.

In the embodiment illustrated in FIG. 8, no contact is etched into silicon layer 113 between trenches 112. Topside metal 124 is able to contact both heavily doped body region 121 and source region 116. In prior art transistors, a high aspect ratio contact (i.e. a deep, narrow contact etched into the silicon) was required for the topside metal to contact both the body and the source regions of the transistor. Body region 118, along with heavily doped region 121, may be implanted into silicon layer 113 in a manner that is self-aligned to trenches 112. Source region 16 may be implanted, for example, into silicon layer 113 in a manner that is self-aligned to gate structure 114a. Because of this, topside metal 124 contacts both body region 118 and source region 116 without the need for a deep contact between trenches 112. Without a deep contact between trenches 112, the pitch (P1) between trenches 112 may be, for example, less than one micron. Although illustrated in FIG. 8 with a relatively planar surface, silicon layer 113 may be non-planar in contact with topside metal 124 depending upon the method of fabricating MOSFET 112. Even in non-planar embodiments, however, no deep contact is required for topside metal 124 and thus, the pitch (P1) may be minimized.

Figure 4:
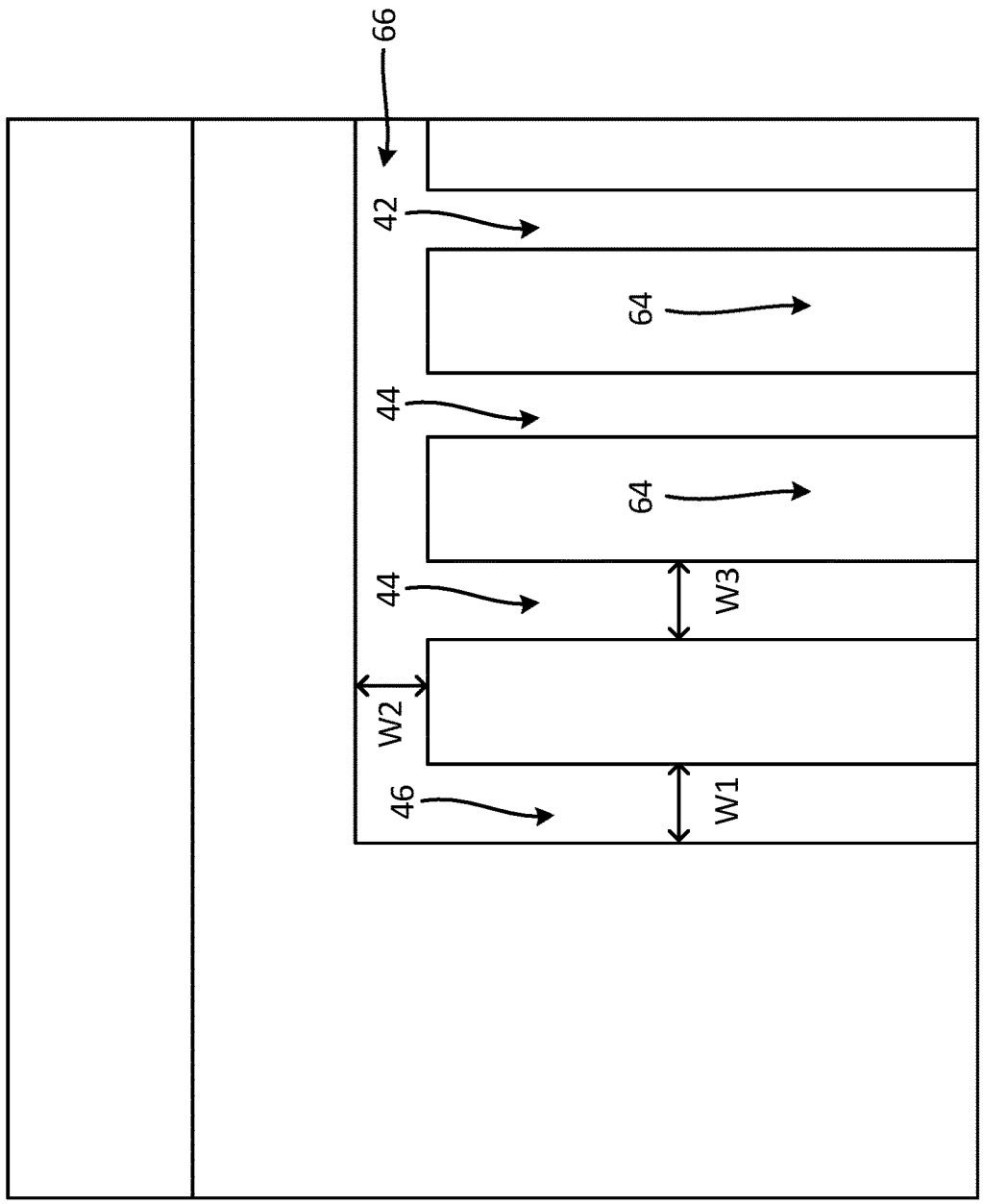
FIG. 4 is a close-up plan view of a layout of a MOSFET with integral edge-termination structures.

FIG. 4 is a close-up plan view of a layout of a MOSFET with integral edge-termination structures. In FIG. 4, the sequence of parallel and longitudinal trenches 42 of the MOSFET is again depicted. Between adjacent longitudinal trenches 42, 44 and 46 in the sequence are defined longitudinal semiconductor pillars 64. The depicted MOSFET also has a perpendicular trench 66 merged with each of longitudinal ends of each of the sequence of parallel longitudinal trenches 42, 44 and 46.

In the depicted embodiment the lateral width W1 of the first (and/or last) longitudinal trench 46 is equal to the lateral width W2 of the perpendicular longitudinal trench 66. The lateral widths W1 and W2 of the first (and/or last) longitudinal trench 46 and the perpendicular longitudinal trench 66 are each greater than the lateral width W3 of the other trenches 42 and 44 in the sequence of longitudinal trenches 42, 44 and 46. These other trenches 42 and 44 include both active-device trenches and other edge-termination trenches. In some embodiments, a ratio between the lateral width W1 of the first (and/or last) longitudinal trench 46 to lateral width W3 of the other trenches 42 and 44 in the sequence of longitudinal trenches 42, 44 and 46 is greater than 1.25, 1.33, 1.5 or 2.0. In some embodiments, a ratio between the lateral width W2 of the perpendicular longitudinal trench 66 to lateral width W3 of the other trenches 42 and 44 in the sequence of longitudinal trenches 42, 44 and 46 is greater than 1.25, 1.33, 1.5 or 2.0.

Some embodiments relate to a MOSFET with integral edge termination structures. The MOSFET includes a sequence of parallel and alternating longitudinal trenches and longitudinal semiconductor pillars. Each of the longitudinal trenches has dielectric sidewalls and a dielectric bottom. The dielectric sidewalls and dielectric bottom are electrically isolating a conductive core within each of the longitudinal trenches from a drain-biased region outside of and adjacent to the longitudinal trench. A first and a last longitudinal trench in the sequence of parallel and alternating trenches has a latitudinal width that is larger than latitudinal widths of the longitudinal trenches between the first and the last longitudinal trench. The MOSFET also includes a perpendicular trench merged with each of longitudinal ends of each of the sequence of parallel longitudinal trenches. Each of the perpendicular trenches has a latitudinal width that is larger than latitudinal widths of the longitudinal trenches between the first and the last longitudinal trench.

Figure 5:
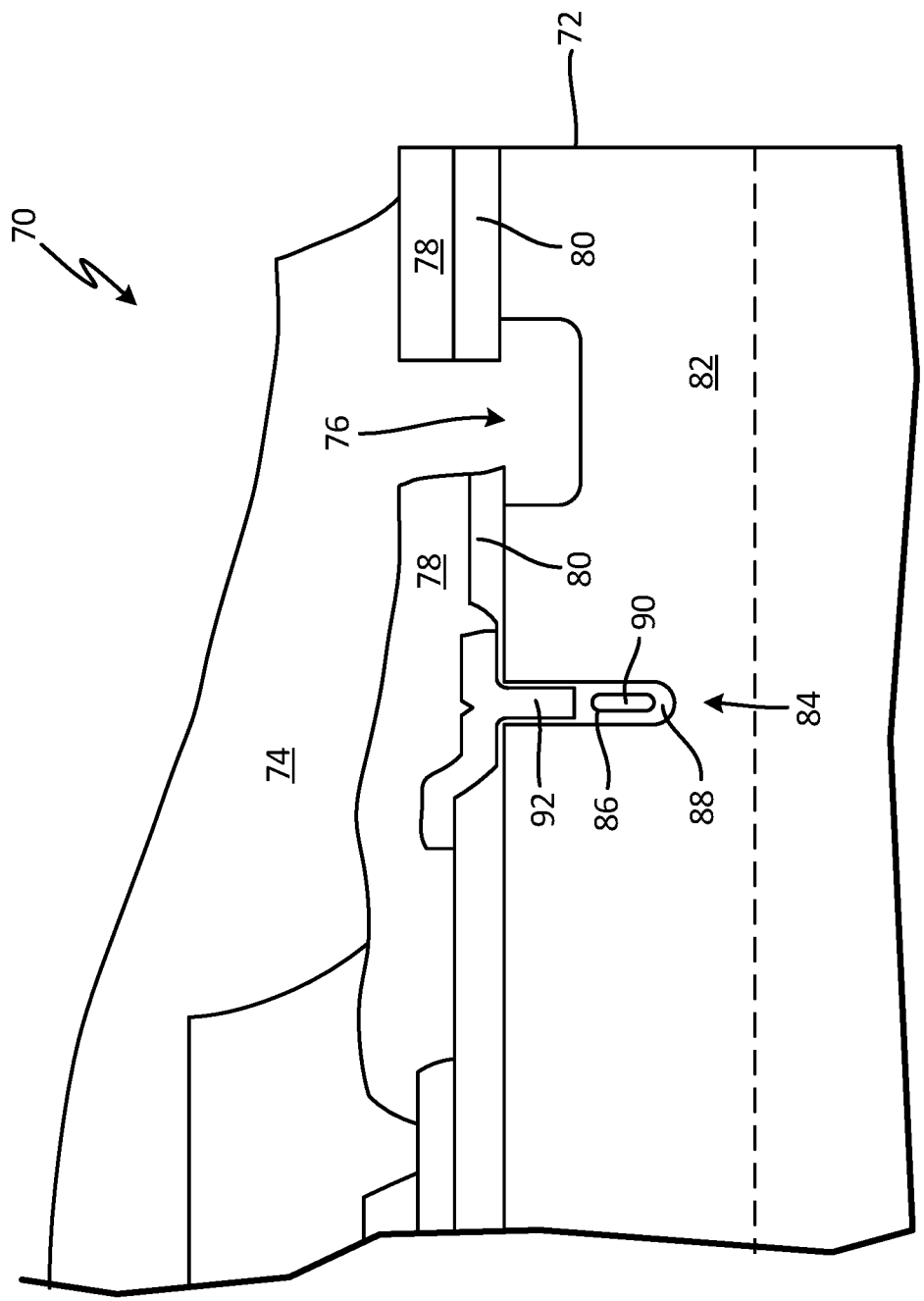
FIG. 5 is drawing of a cross-section of an exemplary seal ring configured to block diffusion of contamination from an edge of a die.

FIG. 5 is drawing of a cross-section of an exemplary seal ring configured to block diffusion of contamination from an edge of a die. In FIG. 5, a peripheral portion of a semiconductor device 70 is shown in cross-section. The die's edge 72 is shown at the right-hand side of the figure. The semiconductor device 70 is covered with polyimide film 74 to protect the semiconductor device 70 from mechanical stress, diffusion of mobile ions and moisture. Polyimide film 74 covers substantially the entire semiconductor device 70 with the exception of bonding pads (not depicted in the figure) located on the top surface of the die. In the depicted embodiment, an outer annular trench 76 is cut through a BoroPhosphoSilicate Glass (BPSG) layer 78 and a High-Density Plasma deposited Glass (HDP) layer 80 and is cut into semiconductor substrate 82. The BPSG 78 and the HDP 80 layers provide a glass passivation layer for semiconductor device 70. In some embodiments, outer annular trench 76 circumscribes a split-gate power MOSFET fabricated in an interior portion of the semiconductor die (not shown in FIG. 1).

In FIG. 5, inner annular trench 84 is depicted as well. Inner annular trench 84 is located between outer annular trench 76 and the split-gate power MOSFET. Inner annular trench 84 has dielectric sidewalls 86 and a dielectric bottom 88. Dielectric sidewalls 86 and dielectric bottom 88 electrically isolate two conductive cores 90 and 92 within inner annular trench 84 from a drain-biased region of the semiconductor die outside of and adjacent to inner annular trench 84. Polysilicon field plate 90 is formed within dielectric sidewalls 86 and dielectric bottom 88. Polysilicon plug 92 is formed within dielectric sidewalls 86 and above polysilicon field plate 90. Polysilicon plug 92 is separated from polysilicon field plate 90 by an HDP glass barrier therebetween. Polysilicon field plate 90 and polysilicon plug 92 can be biased to control an electric field along the periphery of the semiconductor die. Inner annular trench 84 can be referred to as an EQual potential Ring (EQR).

Figure 6:
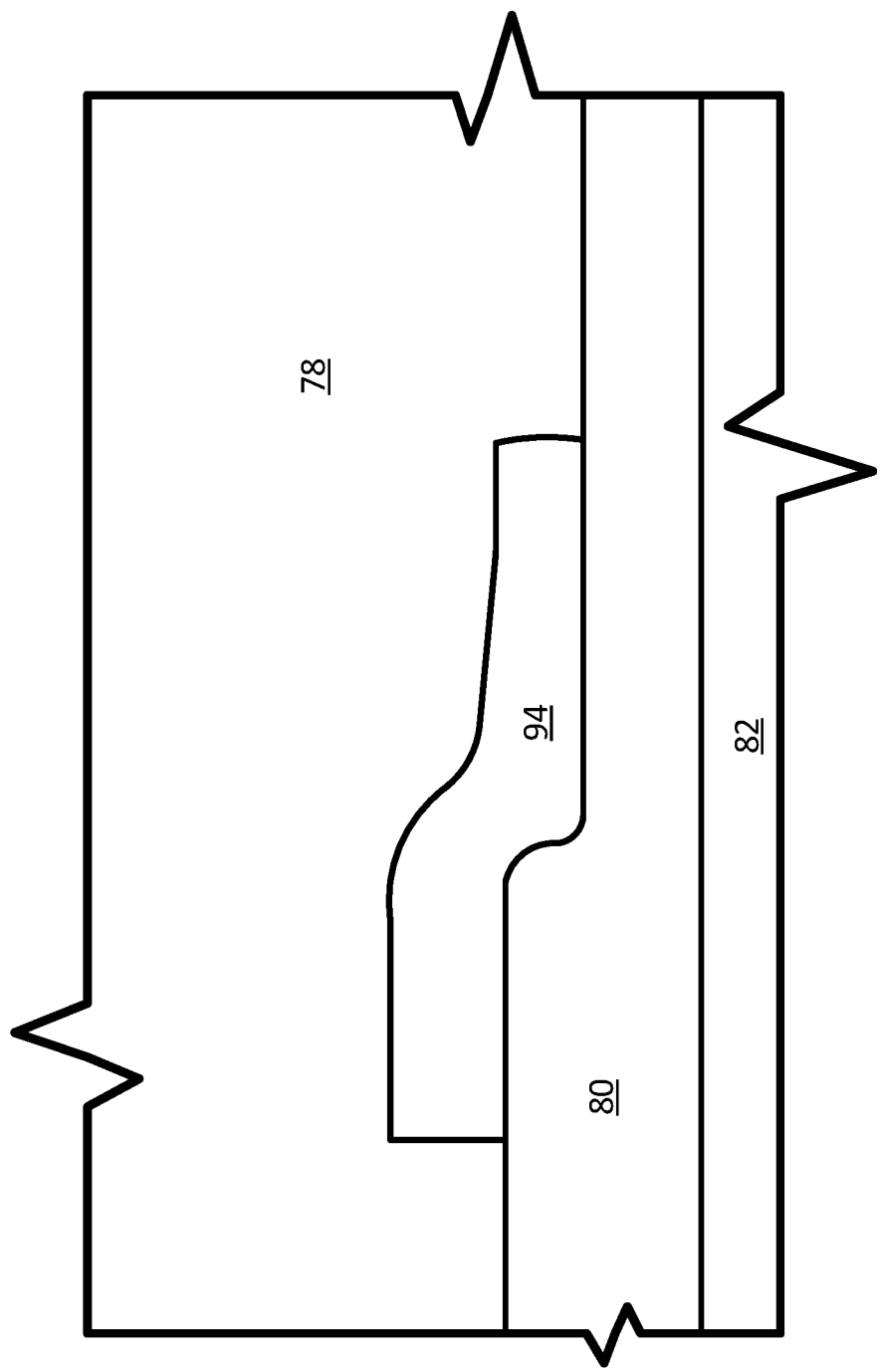
FIG. 6 is a drawing of a cross-section of an exemplary gate polysilicon ring without a trench.

FIG. 6 is a drawing of a cross-section of an exemplary gate polysilicon ring 94 without inner annular trench 84. In the depicted embodiment, no inner annular trench 84 has been formed below the EQR ring 94 of gate poly. Because no inner annular trench 84 has been formed, gate polysilicon ring 94 is perched on the top of the HDP glass 80, which is a relatively thick. The HDP glass permits mobile ions to diffuse therethough. These mobile ions can cause the behavior of the semiconductor device to degrade in performance. Such a configuration is therefore not advantageous as a barrier to diffusion of contaminants. This embodiment is shown as a comparison to the embodiment depicted in FIG. 5. The FIG. 5 embodiment presents a better barrier to diffusion of contaminants by providing a more constricted diffusion path, as will be described with reference to FIG. 7 below.

Figure 7:
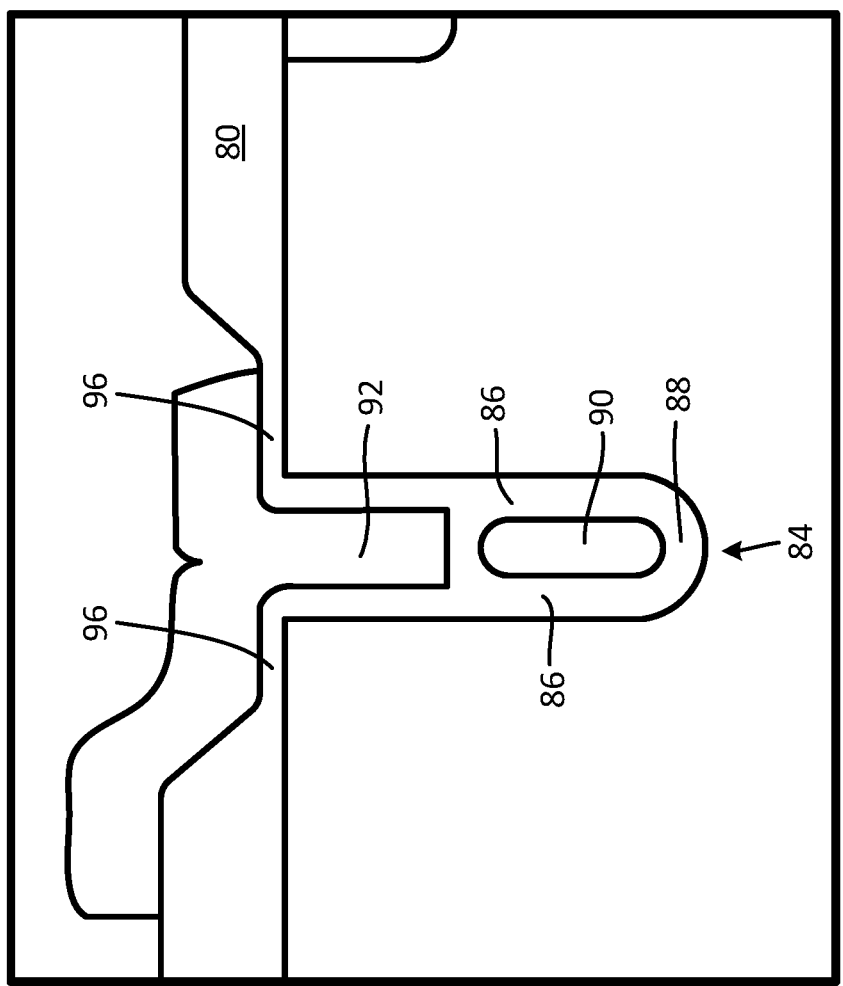
FIG. 7 is a drawing of a cross-section of an exemplary gate polysilicon ring without a trench.

FIG. 7 is a drawing of a cross-section of an exemplary gate polysilicon ring without a trench. The EQR ring depicted in FIG. 5 is shown in close-up in FIG. 7. Contrary to the configuration depicted in FIG. 6, the FIG. 7 embodiment provides a good barrier to diffusion of contaminants. This is because the HDP glass is etched in the inner annular trench regions 84. Thus only a thin gate oxidation 96, which is formed after the HDP etch separates the gate polysilicon from the top of the semiconductor die, resides between polysilicon plug 92 and semiconductor substrate 82. This polysilicon plug 92 presents an improved barrier to the diffusion of contaminants compared with the relatively thick un-etched HDP glass. Both inner annular trench 84 and outer annular trench 76 circumscribe the split-gate power MOSFET. Outer annular trench 76 is proximate edge 72 of the semiconductor die. In some embodiments, polysilicon plug 92 is conductively coupled to a drain of the split-gate power MOSFET so that both polysilicon plug 92 and the drain-biased surrounding region of the semiconductor die are biased at the drain biasing potential.

Some embodiments relate to a semiconductor device that can include a semiconductor die. The semiconductor device includes a split-gate power MOSFET having a source, a gate, and a drain. The semiconductor device has passivation glass on the semiconductor die. The semiconductor device includes two bonding pads configured to provide electrical conduction between a top of the semiconductor device through the passivation glass and to each of the source and the gate of the split-gate power MOSFET. The semiconductor device includes an outer annular trench circumscribing the split-gate power MOSFET. The outer annular trench cuts through the passivation glass on a semiconductor die and cuts into the semiconductor die. The semiconductor device also a polyimide film substantially covering the die except for the two bonding pads. The polyimide film fills the outer annular trench.

In some embodiments, the semiconductor device can further include an inner annular trench between the split-gate power MOSFET and the outer annular trench. The inner annular trench has dielectric sidewalls and a dielectric bottom. The dielectric sidewalls and dielectric bottom electrically isolated a conductive core within the inner annular trench from a drain-biased region of the semiconductor die outside of and adjacent to the inner annular trench. The dielectric sidewalls also isolate a polysilicon plug from the drain-biased region of the semiconductor die outside and adjacent to the inner annular trench. The polysilicon plug is vertically isolated from the conductive core within the inner annular trench via a dielectric. The polysilicon plug can be conductively coupled to the drain biased semiconductor die via a conductive net.

Discussion of Possible Embodiments

The following are non-exclusive descriptions of possible embodiments of the present invention.

Apparatus and associated methods relate to a bonding-pad structure for reducing capacitance to a semiconductor drain-biased substrate of a high-voltage MOSFET. The bonding-pad structure includes a first dielectric layer on top of the semiconductor substrate. The bonding-pad structure includes a first polysilicon plate on top of the first dielectric layer. The bonding-pad structure includes a second dielectric layer on top of the first polysilicon plate. The first and second dielectric layers encapsulate the first polysilicon plate, thereby electrically isolating the first polysilicon plate from the semiconductor substrate. The bonding-pad structure also includes a metal bonding pad directly above the first polysilicon plate and the second dielectric layer, the metal bonding pad electrically isolated from the first polysilicon plate.

The bonding-pad structure of the preceding paragraph can optionally include, additionally and/or alternatively, any one or more of the following features, configurations and/or additional components:

A further embodiment of the foregoing bonding-pad structure can further include a second polysilicon plate on top of the second dielectric layer. The second polysilicon plate can be positioned substantially between the first polysilicon plate and the metal bonding pad and conductively coupled to the gate of the high-voltage MOSFET. The bonding-pad structure can further include a third dielectric layer on top of the second polysilicon plate.

A further embodiment of any of the foregoing bonding-pad structures, wherein the metal bonding pad can be conductively coupled to a gate of the high-voltage MOSFET.

A further embodiment of any of the foregoing bonding-pad structures, wherein the metal bonding pad can be conductively coupled to a gate of the high-voltage MOSFET via, at least in part, a metal wire laterally extending from the metal bonding pad.

A further embodiment of any of the foregoing bonding-pad structures, wherein the metal bonding pad, when viewed from a plan view perspective, can have a periphery that is substantially circumscribed by a periphery of the second polysilicon plate.

A further embodiment of any of the foregoing bonding-pad structures can further include a polyimide film on top of the metal bonding pad, wherein the polyimide film is selectively removed so as to expose a portion of the metal bonding pad to which a bond wire can be bonded.

A further embodiment of any of the foregoing bonding-pad structures can further include a polyimide film on top of the metal bonding pad, wherein the polyimide film is selectively removed so as to expose a portion of the metal bonding pad to which a bond wire can be bonded. The portion of the metal bonding pad exposed by the removal of the polyimide film, when viewed from a plan view perspective, has a perimeter that is entirely circumscribed by a perimeter of the second polysilicon plate.

A further embodiment of any of the foregoing bonding-pad structures, wherein the second polysilicon plate, when viewed from a plan view perspective, can have a periphery that is substantially circumscribed by a periphery of the first polysilicon plate.

A further embodiment of any of the foregoing bonding-pad structures, wherein the second polysilicon plate can be conductively coupled to a source of the high-voltage MOSFET via, at least in part, a polysilicon wire laterally extending from the second polysilicon plate.

A further embodiment of any of the foregoing bonding-pad structures, wherein the second dielectric layer can include a borophosphosilicate glass (BPSG).

A further embodiment of any of the foregoing bonding-pad structures, wherein the third dielectric layer can include a high-density plasma (HDP) deposited glass.

Some embodiments relate to a method of manufacturing a bonding pad. The method includes providing a semiconductor substrate. The method includes depositing a first dielectric layer on top of the semiconductor substrate. The method includes depositing a first polysilicon layer on top of the first dielectric layer. The method includes selectively etching the first polysilicon layer so as to produce a first polysilicon plate. The method includes depositing a second dielectric layer on top of the first polysilicon plate. The first and second dielectric layers can encapsulate the first polysilicon plate, thereby electrically isolating the first polysilicon plate from the semiconductor substrate. The method can also include depositing a metal bonding pad directly above the first polysilicon plate and the second dielectric layer. The metal bonding pad can be electrically isolated from the first polysilicon plate.

The method of the preceding paragraph can optionally include, additionally and/or alternatively, any one or more of the following features, configurations and/or additional components:

A further embodiment of the foregoing method can include depositing a second polysilicon layer on top of the second dielectric layer. The method can include selectively etching the second polysilicon layer so as to produce a second polysilicon plate. The method can include conductively coupling the second polysilicon plate to a source of the high-voltage MOSFET. The method can also include depositing a third dielectric layer on top of the second polysilicon plate.

A further embodiment of any of the foregoing methods can include conductively coupling the metal bonding pad to a gate of the high-voltage MOSFET.

A further embodiment of any of the foregoing methods, wherein conductively coupling the metal bonding pad to a gate of the high-voltage MOSFET can include laterally extending a metal wire from the metal bonding pad.

A further embodiment of any of the foregoing methods, wherein the metal bonding pad, when viewed from a plan view perspective, can have a periphery that is substantially circumscribed by a periphery of the second polysilicon plate.

A further embodiment of any of the foregoing methods can include depositing a polyimide film on top of the metal bonding pad. The method can include selectively removing the polyimide film so as to expose a portion of the metal bonding pad to which a bond wire can be bonded.

A further embodiment of any of the foregoing methods can include depositing a polyimide film on top of the metal bonding pad. The method can include selectively removing the polyimide film so as to expose a portion of the metal bonding pad to which a bond wire can be bonded. The portion of the metal bonding pad exposed by the removal of the polyimide film, when viewed from a plan view perspective, can have a perimeter that is entirely circumscribed by a perimeter of the second polysilicon plate.

A further embodiment of any of the foregoing methods, wherein the second polysilicon plate, when viewed from a plan view perspective, can have a periphery that is substantially circumscribed by a periphery of the first polysilicon plate.

A further embodiment of any of the foregoing methods, wherein conductively coupling the second polysilicon plate to a source of the high-voltage MOSFET can include laterally extending a polysilicon wire from the second polysilicon plate.

A further embodiment of any of the foregoing methods, wherein depositing the second dielectric layer on top of the second polysilicon plate can include depositing a borophosphosilicate glass (BPSG).

A further embodiment of any of the foregoing methods, wherein depositing the third dielectric layer on top of the first polysilicon plate can include depositing glass using a high-density plasma (HDP).

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed.

The invention claimed is:

1. A bonding-pad structure for reducing capacitance to a semiconductor drain-biased substrate of a high-voltage MOSFET, the bonding-pad structure comprising:
a first dielectric layer on top of the semiconductor substrate;
a first polysilicon plate on top of the first dielectric layer;
a second dielectric layer on top of the first polysilicon plate, wherein the first and second dielectric layers encapsulate the first polysilicon plate, thereby electrically isolating the first polysilicon plate from the semiconductor substrate;
a metal bonding pad directly above the first polysilicon plate and the second dielectric layer, the metal bonding pad electrically isolated from the first polysilicon plate and conductively coupled to a gate of the high-voltage MOSFET, wherein a top surface of the metal bonding pad has an exposed portion to which a bond wire can be bonded;
a second polysilicon plate on top of the second dielectric layer, the second polysilicon plate positioned substantially between the first polysilicon plate and the metal bonding pad and conductively coupled to the gate of the high-voltage MOSFET; and
a third dielectric layer on top of the second polysilicon plate.

2. The bonding-pad structure of claim 1, wherein the metal bonding pad, when viewed from a plan view perspective, has a periphery that is circumscribed by a periphery of the second polysilicon plate.

3. The bonding-pad structure of claim 1, further comprising:
a polyimide film on top of the metal bonding pad, wherein the polyimide film is selectively removed so as to expose the portion of the top surface of the metal bonding pad to which a bond wire can be bonded.

4. The bonding-pad structure of claim 1, wherein the second polysilicon plate, when viewed from a plan view perspective, has a periphery that is circumscribed by a periphery of the first polysilicon plate.

5. The bonding-pad structure of claim 1, wherein the second polysilicon plate is conductively coupled, via, at least in part, a polysilicon wire laterally extending therefrom, to a source of the high-voltage MOSFET.

6. The bonding-pad structure of claim 1, wherein the third dielectric layer includes a high-density plasma (HDP) deposited glass.

7. The bonding-pad structure of claim 1, wherein the metal bonding pad is conductively coupled, via, at least in part, a metal wire laterally extending therefrom, to a gate of the high-voltage MOSFET.

8. The bonding-pad structure of claim 1, wherein the second dielectric layer includes a borophosphosilicate glass (BPSG).

9. A bonding-pad structure for reducing capacitance to a semiconductor drain-biased substrate of a high-voltage MOSFET, the bonding-pad structure comprising:
a first dielectric layer on top of the semiconductor substrate;
a first polysilicon plate on top of the first dielectric layer;
a second dielectric layer on top of the first polysilicon plate, wherein the first and second dielectric layers encapsulate the first polysilicon plate, thereby electrically isolating the first polysilicon plate from the semiconductor substrate; and
a metal bonding pad directly above the first polysilicon plate and the second dielectric layer, the metal bonding pad electrically isolated from the first polysilicon plate and conductively coupled to a gate of the high-voltage MOSFET, wherein a top surface of the metal bonding pad has an exposed portion to which a bond wire can be bonded,
wherein the metal bonding pad is conductively coupled, via, at least in part, a metal wire laterally extending therefrom, to a gate of the high-voltage MOSFET.

10. The bonding-pad structure of claim 9, further comprising a polyimide film on top of the metal bonding pad, wherein the polyimide film is selectively removed so as to expose a portion of the metal bonding pad to which a bond wire can be bonded.

11. A bonding-pad structure for reducing capacitance to a semiconductor drain-biased substrate of a high-voltage MOSFET, the bonding-pad structure comprising:
a first dielectric layer on top of the semiconductor substrate;
a first polysilicon plate on top of the first dielectric layer;
a second dielectric layer on top of the first polysilicon plate, wherein the first and second dielectric layers encapsulate the first polysilicon plate, thereby electrically isolating the first polysilicon plate from the semiconductor substrate;
a metal bonding pad directly above the first polysilicon plate and the second dielectric layer, the metal bonding pad electrically isolated from the first polysilicon plate and conductively coupled to a gate of the high-voltage MOSFET, wherein a top surface of the metal bonding pad has an exposed portion to which a bond wire can be bonded; and
a polyimide film on top of the metal bonding pad, wherein the polyimide film is selectively removed so as to expose a portion of the metal bonding pad to which a bond wire can be bonded.

12. A bonding-pad structure for reducing capacitance to a semiconductor drain-biased substrate of a high-voltage MOSFET, the bonding-pad structure comprising:
a first dielectric layer on top of the semiconductor substrate;
a first polysilicon plate on top of the first dielectric layer;
a second dielectric layer on top of the first polysilicon plate, wherein the first and second dielectric layers encapsulate the first polysilicon plate, thereby electrically isolating the first polysilicon plate from the semiconductor substrate; and
a metal bonding pad directly above the first polysilicon plate and the second dielectric layer, the metal bonding pad electrically isolated from the first polysilicon plate and conductively coupled to a gate of the high-voltage MOSFET, wherein a top surface of the metal bonding pad has an exposed portion to which a bond wire can be bonded,
wherein the second dielectric layer includes a borophosphosilicate glass (BPSG).

13. A method of manufacturing a bonding pad that has a reduced capacitance to a semiconductor drain-biased substrate of a high-voltage MOSFET, the method comprising:
providing a semiconductor substrate;
depositing a first dielectric layer on top of the semiconductor substrate;
depositing a first polysilicon layer on top of the first dielectric layer;
selectively etching the first polysilicon layer so as to produce a first polysilicon plate;
depositing a second dielectric layer on top of the first polysilicon plate, wherein the first and second dielectric layers encapsulate the first polysilicon plate, thereby electrically isolating the first polysilicon plate from the semiconductor substrate;
depositing a metal bonding pad directly above the first polysilicon plate and the second dielectric layer, wherein the metal bonding pad is electrically isolated from the first polysilicon plate;
conductively coupling the metal bonding pad to a gate of the high-voltage MOSFET; and
depositing a polyimide film on top of the metal bonding pad;
selectively removing the polyimide film so as to expose a portion of the metal bonding pad to which a bond wire can be bonded;
depositing a second polysilicon layer on top of the second dielectric layer;
selectively etching the second polysilicon layer so as to produce a second polysilicon plate;
conductively coupling the second polysilicon plate to a source of the high-voltage MOSFET; and
depositing a third dielectric layer on top of the second polysilicon plate.

14. The method of claim 13, wherein conductively coupling the metal bonding pad to a gate of the high-voltage MOSFET comprises laterally extending a metal wire from the metal bonding pad.

15. The method of claim 13, wherein the metal bonding pad, when viewed from a plan view perspective, has a periphery that is substantially circumscribed by a periphery of the second polysilicon plate.

16. The method of claim 13, wherein the second polysilicon plate, when viewed from a plan view perspective, has a periphery that is substantially circumscribed by a periphery of the first polysilicon plate.

17. The method of claim 13, wherein conductively coupling the second polysilicon plate to a source of the high-voltage MOSFET comprising laterally extending a polysilicon wire from the second polysilicon plate.

18. The method of claim 13, wherein depositing the second dielectric layer on top of the second polysilicon plate comprises depositing a borophosphosilicate glass (BPSG).

19. The method of claim 13, wherein depositing the third dielectric layer on top of the first polysilicon plate comprises depositing glass using a high-density plasma (HDP).

* * * * *

UNITED STATES PATENT AND TRADEMARK OFFICE
CERTIFICATE OF CORRECTION

PATENT NO. : 10,896,885 B2  
APPLICATION NO. : 15/703674  
DATED : January 19, 2021  
INVENTOR(S) : Peter West et al.

Page 1 of 1

It is certified that error appears in the above-identified patent and that said Letters Patent is hereby corrected as shown below:

In the Specification

Column 2, Line 14, delete "FIG. 5 is drawing" and replace with --FIG. 5 is a drawing--.

Column 3, Line 16, delete "element)" and replace with --elements)--.

Column 4, Line 11, delete "plate 18 the" and replace with --plate 18, the--.

Column 4, Line 45, delete "Polyimide" and replace with --PolyImide--.

Column 5, Line 9, delete "polysilicon plate." and replace with --polysilicon plate 22.--.

Column 5, Line 28, delete "isolating" and replace with --isolate--.

Column 6, Line 23, delete "source region 16" and replace with --source region 116--.

Column 7, Line 14, delete "is drawing" and replace with --is a drawing--.

Column 7, Line 40, delete "isolate" and replace with --isolates--.

Column 7, Lines 57-58, delete "is a relatively" and replace with --is relatively--.

Column 7, Line 59, delete "therethough" and replace with --therethrough--.

Column 8, Line 34, delete "covering" and replace with --covers--.

Column 8, Line 42, delete "isolated" and replace with --isolate--.

Column 14, Line 20, delete "comprising" and replace with --comprises--.

Signed and Sealed this  
Twenty-ninth Day of March, 2022

Drew Hirshfeld  
*Performing the Functions and Duties of the*  
*Under Secretary of Commerce for Intellectual Property and*  
*Director of the United States Patent and Trademark Office*